United States Patent [19]

Hamada et al.

[11] 4,307,393
[45] Dec. 22, 1981

[54] TREND GRAPH DISPLAY SYSTEM

[75] Inventors: Nagaharu Hamada, Hitachi; Toshitaka Hara, Owariasahi; Mitsuo Kikkawa; Yukitaka Hayashi, both of Hitachi, all of Japan

[73] Assignee: Hitachi, Ltd., Tokyo, Japan

[21] Appl. No.: 958,991

[22] Filed: Nov. 9, 1978

[30] Foreign Application Priority Data

Nov. 11, 1977 [JP] Japan .................. 52-134631

[51] Int. Cl.$^3$ ............................................. G06F 3/14
[52] U.S. Cl. ................................. 340/722; 340/728; 340/744; 340/721
[58] Field of Search .............. 340/747, 722, 152, 154, 340/744, 745, 715, 803, 728, 721

[56] References Cited

U.S. PATENT DOCUMENTS

| | | | |
|---|---|---|---|
| 3,648,270 | 3/1972 | Metz et al. | 340/747 |
| 3,686,662 | 8/1972 | Blixt et al. | 340/747 |
| 3,765,009 | 10/1973 | Graves et al. | 340/747 |
| 3,792,464 | 2/1974 | Hamada et al. | 340/747 |
| 3,812,491 | 5/1974 | Barraclough et al. | 340/747 |
| 3,894,292 | 7/1975 | Wilkinson et al. | 340/747 |
| 3,984,862 | 10/1976 | Volz | 340/722 |
| 4,119,956 | 10/1978 | Murray | 340/728 |

*Primary Examiner*—Marshall M. Curtis
*Attorney, Agent, or Firm*—Craig and Antonelli

[57] ABSTRACT

A cathode ray tube having a viewing screen on which time points represented by a plurality of points spaced from one another with a predetermined time interval are displayed in the raster direction, while display quantities of trend graphs are displayed as functions of the time points in the direction perpendicular to the raster direction by a plurality of points spaced from one another with a predetermined interval. A raster scanning is effected by sweeping the viewing screen with a scanning point whereby the scanning lines thus produced are correlated to the spaced points representing the display quantities. Apparatus stores the display quantities of the trend graph corresponding to the time points, sequentially reads out the display quantities from the memory apparatus in the order of the time points, and compares the display quantities read out from the memory apparatus with a display quantity represented by an instant scan line. The comparison apparatus compares the display quantity read out corresponding to an instant time point and an instant position of the scanning spot of the instant scan line with a display quantity represented by an instant scan line, supplies a video signal to the cathode ray tube when the instant display quantity represented by the instant scan lines lies in a range delimited by the display quantity at the instant time point and the display quantity at the select one time point of the time points immediately preceding and following the instant time point.

15 Claims, 11 Drawing Figures

TREND GRAPH DISPLAY SYSTEM

The present invention relates to a trend graph display system. In particular, the invention concerns a trend graph display apparatus of a raster scan type which serves to display a variation of a physical quantity as a function of time and in which the time is taken in the raster direction, i.e. along the abscissa, and in which the physical quantity to be displayed is taken in the direction perpendicular to the raster, i.e. along the ordinate.

The display apparatus using a cathode ray tube (hereinafter referred to simply as CRT) is widely employed as one of the most convenient means for man-machine communication in the electronic computer systems. Among such CRT display apparatus, there has been known a display apparatus which serves to display how a particular physical quantity varies as a function of time, i.e. a so-called trend graph.

The conventional CRT display apparatus incorporates therein a deflection system of a raster scanning type which is effective to sweep or scan the viewing screen in the horizontal direction starting from the upper left corner of the screen with the horizontal line scanning sequentially shifted downwardly thereby to generate a raster, as is common in the television receivers. In this connection, since the control circuit for the raster scanning can be implemented in a much facilitated manner when the time axis is taken along the ordinate, namely in the direction perpendicular to the scanning or sweeping direction, various approaches have long been made in this sense. However, for the observation of the graph display as generated, it is more natural and convenient to take the time axis along the abscissa, i.e. in the direction corresponding to the scanning direction. Recent progress in the technology of semiconductor memories has stimulated the attempt to implement the trend graph display with the time elapse taken along the abscissa.

For example, an approach is disclosed in Japanese Patent Application filed Dec. 25, 1971 in the name of Mitsubishi Electric Corporation under the title "Display System Of Trend Graph" and issued Dec. 23, 1976 as Publication No. 51-48862. According to the disclosure, time points represented by a number of spaced points are taken along the abscissa on the display screen of CRT, while physical quantity of a trend graph to be displayed is taken along the ordinate under representation by a number of spaced points, whereby the correspondence of the spaced points representing the physical quantity to the scan lines has been accomplished. To this end, values or magnitudes of the physical quantity of a trend graph to be displayed at every time point are stored in a memory, and the value of the physical quantity at a time point corresponding to the instantaneous or present scan point on the display screen is read out from the memory to be compared with the physical quantity represented by an instant scan line. When coincidence is found, a coincidence signal is superposed on the video signal of CRT to produce a bright point or spot at the instantaneous scan point on a scan line.

The trend graph display apparatus of the arrangement outlined above is however disadvantageous in that image or visual quality tends to be degraded since the display of a physical quantity in a form of discrete points on the scan lines is effected in such a manner that only one bright spot is displayed at each time point. For example, when the slope of the trend graph becomes steeper, distance between the adjacent two spots is also increased and is found to be uncomfortable for observation and the relations among the spots tends to be more ambiguous, thereby deteriorating the continuity of the trend graph.

Another trend graph display system is disclosed, for example, in U.S. patent application Ser. No. 103,741 entitled "Historical Data Display", filed Jan. 4, 1971 by Bunker et al and issued Jan. 12, 1973 as U.S. Pat. No. 3,739,369 assigned now to General Electric Company. According to this prior art, a value of a physical quantity at a display time point corresponding to the instant scan point of a scan line on a CRT screen is read out from a memory and a bright spot is produced at the position of the instant scan point on the scan line, provided that the value of physical quantity represented by an instant scan line is not greater than the value of the physical quantity at the instant time point read from the memory. In this display system, the region confined between the trend line as displayed and the base line or abscissa is shadowed through shading. Consequently, continuity among the spots will not be lost, even when the slope of the graph becomes steeper. However, the graph as displayed is not in the form of a line or curve but is represented as area. In other words, desired curved line representation can not be attained.

Further, another approach is disclosed in U.S. patent application Ser. No. 88,924 under the title "Circuit Arrangement For The Presentation Of Waveforms On Viewing Screens Utilizing Raster Deflection" filed Nov. 12, 1970 in the name of Blixt et al and issued Aug. 22, 1972 as U.S. Pat. No. 3,686,662 assigned now to International Standard Electric Corporation. According to the disclosure, display time points represented by a number of spaced points are taken along the abscissa of a viewing screen of CRT, while physical quantity of the trend graph is displayed by a number of spaced points along the ordinate of the viewing screen, wherein the spaced points representing the physical quantity are correspondingly correlated to the scan lines. The physical quantity to be displayed is provided for every predetermined number of display time points, e.g. every eighth time point and stored in a memory. When the physical quantity at the predetermined time point as stored in the memory coincides with the physical quantity represented by the instant scan line, a bright spot is generated at the corresponding scan point with the physical quantity being interpolated at each of the seven time points between the adjacent predetermined time points. This display system thus requires a complicated circuit arrangement for interpolation. Because the interpolation is made between the adjacent predetermined time points, it becomes difficult to attain a graphic presentation with a desired accuracy, particularly when the physical quantity to be displayed as the trend graph undergoes rapid and steep variations.

Accordingly, an object of the invention is to eliminate the drawbacks of the hitherto known trend graph display systems described above.

The above and other objects, features and advantages of the invention will be more apparent from the following description with reference to the drawings, in which.

Figure 1:
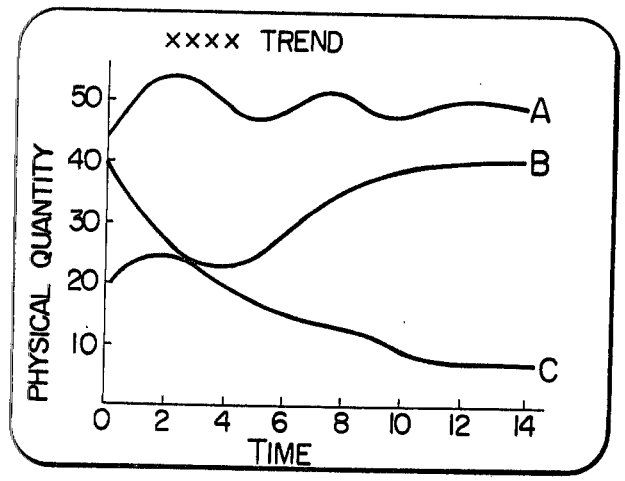
FIG. 1 shows an example of graphic representation on a viewing screen of a CRT trend graph display system according to the present invention.

The invention will be described in conjunction with preferred embodiments shown, only by way of example, in the drawings.

Referring to FIG. 1 which illustrates examples of the trend graph images on a viewing screen of a CRT display apparatus according to the invention, time is taken along the abscissa, while physical quantities are taken along the ordinate as functions of time as represented by trend lines or curves A, B and C.

Figure 2:
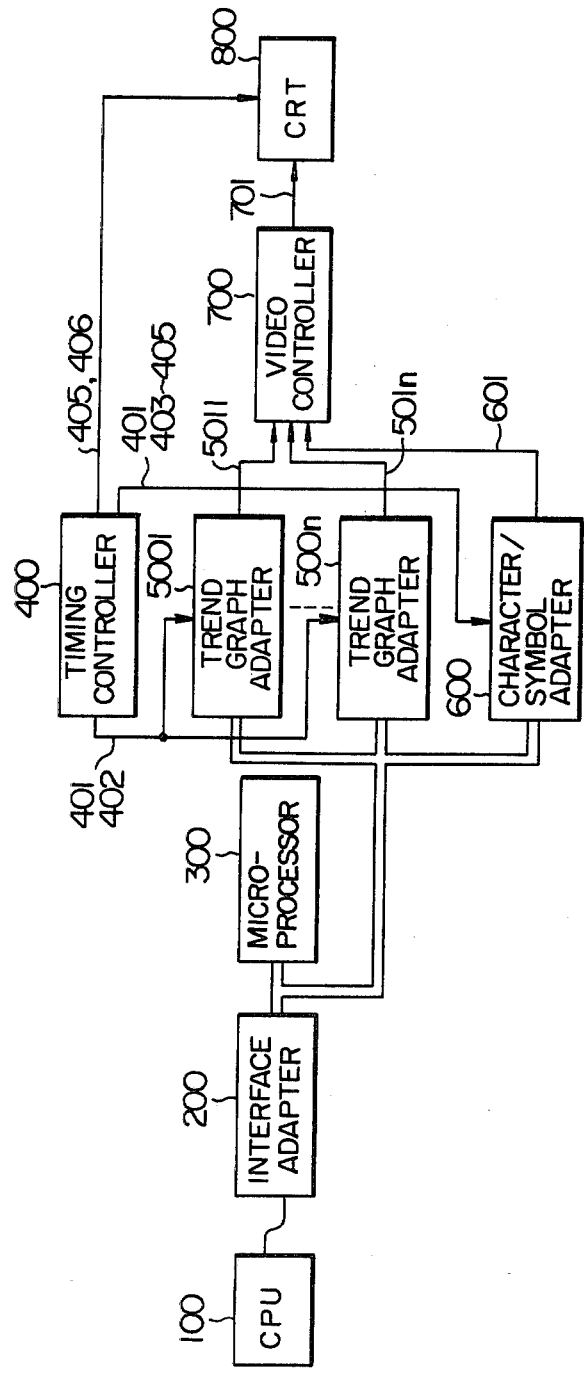
FIG. 2 is a block diagram showing a typical example of the graphic display system to which the present invention is to be applied.

FIG. 2 shows in a block diagram a typical example of the graphic display system to which the invention can be applied. Referring to the figure, numeral 200 denotes an interface adapter which serves to connect an external central processing unit (CPU) 100 or other external information or data sources to a micro-processor 300 through data bus. Trend graph video signals 501*l* to 501*n* respectively available from trend graph adapters 500*l* to 500*n* and character/symbol video signal 601 available from a character/symbol adapter 600 are ORed through a video controller 700, the output video signal 701 from which is applied to CRT 800 thereby displaying graph and characters etc. on the screen thereof. The trend graph adapter assembly comprises a plurality of the individual trend graph adapters 500*l* to 500*n* in number corresponding to the number of trend graph lines to be displayed. The interface adapter 200 functions to store the character/symbol data from CPU 100 in the character/symbol adapter in a distributed manner and at the same time operate to store the trend graph data in the trend adapters 500*l* to 500*n* in a distributed manner. The data stored in the trend graph adapters are read out sequentially and output as the trend graph video signals 501*l* to 501*n* under the control of dot timing signal 401 and scanning line number signal 402 from a timing controller 400 of a conventional type. The data stored in the character/symbol adapter are sequentially read out in response to the dot timing signal 401, a character/symbol timing signal 403, a raster signal 402 and a line signal 405 and output as the character/symbol video signal 601. The timing controller 400 comprises an oscillator and frequency dividers, whereby the dot timing signal is produced through frequency division of the output frequency of the oscillator, the character/symbol timing signal is produced through corresponding frequency division of the dot timing signal, the raster signal is produced through frequency division of the character/symbol timing signal, the line signal is produced through frequency division of the raster signal and finally vertical synchronizing signal is produced through frequency division of the line signal. CRT 800 responds to the raster signal 405 and vertical synchronizing signal 406 from the timing controller and the video signal 701 from the video controller to generate displays of characters and/or symbols as well as graphic trend curves on the viewing screen.

Figure 3:
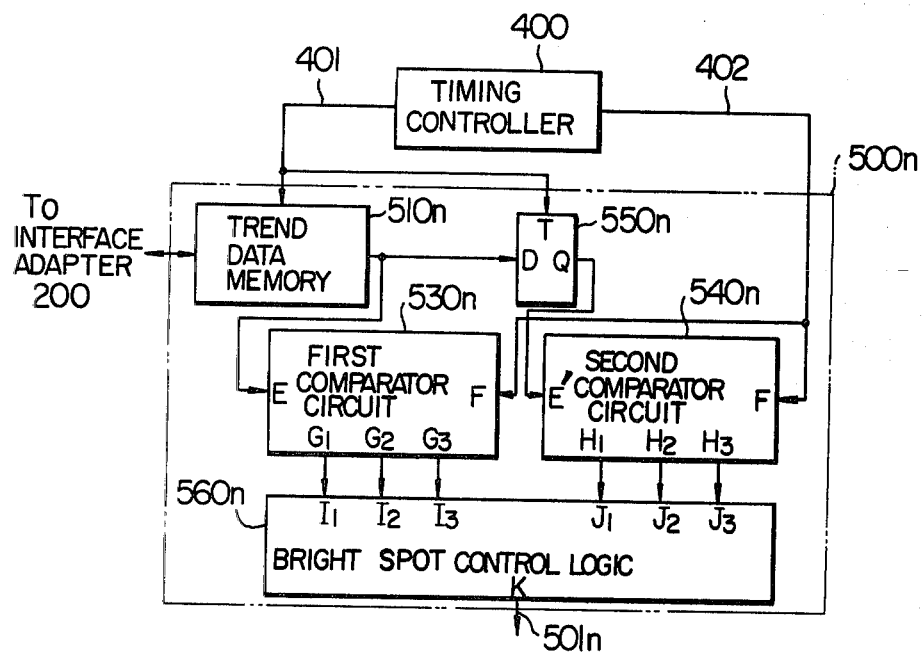
FIG. 3 is a block diagram showing an exemplary embodiment of a trend graph adapter according to the invention.

FIG. 3 shows in a block diagram an exemplary embodiment of the trend graph adapter according to the invention. Since the circuit arrangement of the trend graph adapters 500*l* to 500*n* shown in FIG. 2 are identical with one another, description will be made of the adapter 500*n*, by way of example. Referring to FIG. 3, the trend graph adapter 500*n* comprises a trend data memory 510*n*, a first comparator circuit 530*n*, a second comparator circuit 540*n*, a data latch circuit 550*n* and a bright spot control logic circuit 560*n*. The trend data memory 510 may be constituted by a random access memory or a circulating type memory such as shift registers. Data representing a physical quantity to be displayed at individual display time points taken along the abscissa of the viewing screen are stored in the trend data memory 510 from CPU 100 through the interface adapter 200 in the sequence corresponding to the order of the display time points. Assuming for example that the resolving power is represented by 256 dots along the abscissa of the display screen (i.e. number of time points is equal to 256) and that the resolution along the ordinate is represented by dot number of 256 (i.e. the number of scanning lines is equal to 256), the physical quantity of the trend curve at every display time point is converted into a display quantity of a word length of 8 bits through the micro-processor 300 and stored in the memory 510*n*. For example, referring to FIG. 5, when a physical quantity having magnitudes variable in the range of 0 to 60 is to be displayed as a trend curve on the screen in the region covering the scanning lines numbered n to n+15, the magnitudes 0 to 60 of the physical quantity are converted in terms of the numbers of scanning lines which are then used as the quantities to be displayed. Accordingly, the magnitudes 0 and 60 of the physical quantities are represented by the numbers of the scanning lines n+15 and n in terms of the corresponding 8-bit words, respectively. Although the scanning lines are shown as numbered in the increasing direction from the top toward the bottom of the screen, it is of course possible to allot the number to the scanning line in the reverse direction. In this manner, 8-bit words each representing a magnitude of a physical quantity at a display time point are stored in the sequence corresponding to the predetermined order of the display time points in the memory 510*n* which is thus required to have a storage capacity of 256 words each consisting of 8 bits, i.e. storage capacity of 256 bytes. The contents in the memory 510*n* is read out sequentially in the order of the associated display time point on the one-word basis under the control of the dot timing signal 401 from the timing controller 400 and supplied to the latch circuit 550*n* and the input terminal E of the first comparator circuit 530*n*. It is to be noted that the display time point for the magnitude of the physical quantity as read out from the memory 510*n* is the very time point that corresponds to the instant position of the scanning spot on the CRT screen. Accordingly, the read-out of the quantity from the memory is effected at every display time point which corresponds to the position of every scanning spot on each of the scanning lines on the viewing screen. In the above assumed case, 256 dot timing pulses are produced during a single line scan period. The latch circuit 550n responds to the dot timing signal 401 applied to the trigger terminal T thereof to fetch therein the display data supplied to the data input terminal D and then responds to the succeeding dot timing signal 401 to transfer the fetched data from the output terminal Q to the input terminal E' of the second comparator circuit 540n. In this manner, the latch circuit 550n serves to delay the output data from the memory 510n for a single display time interval which is a time span between the two adjacent display time points (i.e. the quiescent period of the dot timing pulses). The signal 402 representing the number of the scanning line is applied from the timing controller 400 to the input terminals F of the first and the second comparators 530n and 540n. This signal 402 represents the number allotted to the instant scanning line on the screen in a binary code of 8 bits. Accordingly, the scanning line number signal 402 continues to be present at the input terminals E' of the comparators 530n and 540n so long as the associated line is being scanned, i.e. during the duration from the time point $t_0$ to $t_{255}$. Such scanning line number signal 402 may be produced by a counter provided in the timing controller 400 adapted to count upwardly the raster signals and to be reset by the vertical synchronizing signal. In the case where the scanning line number is allotted in the decreasing order toward the bottom of the screen, the counter may be of course constituted by a down counter.

During the single line scanning period in which the scan line number signal 402 is held, data of the quantity to be displayed are read out from the trend data memory 510n in the sequence corresponding to the order of the display time points and subjected to comparison through the comparator circuits 530n and 540n. More specifically, the first comparator circuit 530n compares the 8-bit signal representing the scan line number (signal 402) with the data quantity of the trend graph to be displayed at the instant display time point, while the second comparator circuit 540n compares the scan line number signal 402 with the trend data at the time point which immediately preceded the instant time point for the single display time interval described above.

The first comparator circuit 530n compares the input data at the input terminals E and F and produces outputs at the output terminals $G_1$, $G_2$ and $G_3$, respectively, when the conditions defined below are fulfilled. In particular, when the data of the physical quantity read out from the memory 510n and applied to the input terminal E is represented by E, while the 8-bit data representing the scan line number applied to the input terminal F is represented by F, output signals (i.e. binary signals "1") are produced from the output terminals $G_1$, $G_2$ and $G_3$ when the following conditions are satisfied:

$$G_1:E<F, G_2:E=F, \text{ and } G_3:E>F$$

On the other hand, the second comparator circuit 540n serves to compare the input data applied to the input terminals E' and F. When the display data of the physical quantity applied to the input terminal E' is represented by E', while the data applied to the terminal F is represented by F, there are produced output signals (i.e. binary signals "1") at respective output terminals $H_1$, $H_2$ and $H_3$ when the following conditions are fulfilled:

$$H_1:E'<F, H_2:E'=F, \text{ and } H_3:E'>F$$

The circuit arrangement of the comparators for implementing the comparison functions described above will readily occur to those skilled in the art. One group of the input terminals $I_1$, $I_2$ and $I_3$ of the bright spot control logic circuit 560n are connected to the output terminals $G_1$, $G_2$ and $G_3$, respectively, of the first comparator circuit 530n, while the other group of input terminals $J_1$, $J_2$ and $J_3$ of the control logic circuit 560n are connected to the output terminals $H_1$, $H_2$ and $H_3$ of the second comparator circuit 540n. The bright spot control logic circuit is so arranged that the video signal 501n is produced at the output terminal K when the input signals $I_1$, $I_2$, $I_3$, $J_1$, $J_2$ and $J_3$ respectively applied to the input terminals $I_1$, $I_2$, $I_3$, $J_1$, $J_2$ and $J_3$ satisfy the following condition:

$$K=I_1 \times J_3 + I_2 + I_3 \times J_1 \qquad (1)$$

In other words, the bright spot control logic circuit 560n produces the video signals 501n at the individual display time points thereby to produce the bright spots at the associated scan points, when at least one of the following conditions is met; namely, (a) when the coincidence occurs between the quantity to be displayed at the instant time point as read out from the trend data memory and the instant scan line number value (i.e. when the signal "1" is present at the terminal $I_2$), (b) when the instant scan line number value is greater than the display quantity at the instant time point and smaller than the display quantity at the immediately preceding time point (i.e. when the input signal "1" is present at both of the input terminals $I_1$ and $J_2$), and (c) when the instant scan line number value is smaller than the display quantity at the instant time point and greater than the display quantity at the immediately preceding time point (i.e. when both of the input terminals $I_3$ and $J_1$ are applied with the input signals "1").

Figure 6A:
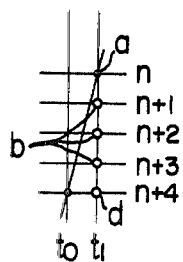
FIGS. 6A, 6B, 6C and 6D show other examples of the trend graphs produced by the trend graph adapter according to the invention.
Figure 6B:
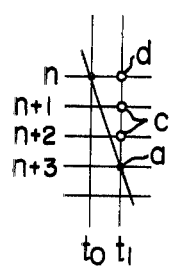

Referring to FIG. 6A, assuming for example that the display quantity is equal to n at the instant display time point $t_1$ while the display quantity at the immediately preceding time point $t_0$ is equal to n+4, the bright spots will be produced not only at the end point a where the scan line number coincides with the instant display quantity but also at the points b on the scanning lines where the scan line numbers are larger than the instant display quantity and smaller than the display quantity at the immediately preceding time point $t_0$. In a similar manner, when the display quantity at the instant time point $t_1$ is equal to n+3 with the display quantity at the immediately preceding time point $t_0$ being equal to n, for example, then the bright spots will be produced not only at the end point a but at the scan points C on the scanning lines numbered n+1 and n+2, as shown in FIG. 6B.

In this manner, even when the trend data undergoes a rapid variation, clear display of the trend curve can be accomplished because of the interpolation of the bright spots on the intermediate scanning line(s), as described above and also illustrated in FIG. 5 by lines 1 and m.

In the foregoing description concerning the exemplary embodiment shown in FIG. 3, it has been assumed that the bright spot control is effected in accordance with the conditions defined by the expression (1) so that the bright spot is produced in dependence on the instant display quantity stored in the trend data memory 510n.

Figure 4A:
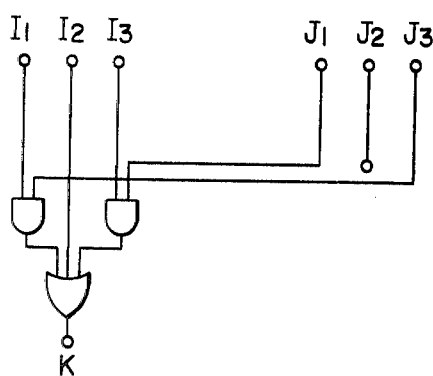
FIGS. 4A and 4B illustrate exemplary embodiments of bright point control logic circuits which can be employed in the trend graph adapter according to the invention.

However, such control may be effected under the logic conditions that $K = I_1 \times J_3 + I_2 + J_2 + I_3 \times J_1$, if desired. In this case, the bright spot will be produced at the point d shown in FIGS. 6A and 6B where the display quantity at the immediately proceding time point coincides with the instant scan line number. For implementing the above conditions, the input $J_2$ may be connected to an OR-gate in FIG. 4A.

Further, although the relation between the instant display quantity and the one at the immediately preceding display time point has been taken into consideration in the foregoing description, it will be appreciated that similar effect can be attained starting from the relation between the instant display quantity and the one at the immediately following time point. In this case, circuit arrangement shown in FIG. 3 is so arranged that the display quantity at the time point immediately following the instant time point is read out from the trend data memory 510n. To this end, the first comparator circuit 530n will receive at the input terminal E the display quantity at the immediately following time point, while the input terminal E' of the second comparator circuit 540n is applied with the quantity to be displayed at the instant time point. In this conjunction, the bright spot control logic circuit may be constructed such that the video signal K can be produced at the output terminal K, when the following input conditions are logically satisfied:

$$K = I_1 \times J_3 + J_2 + I_3 \times J_1 \quad (2)$$

Figure 4B:
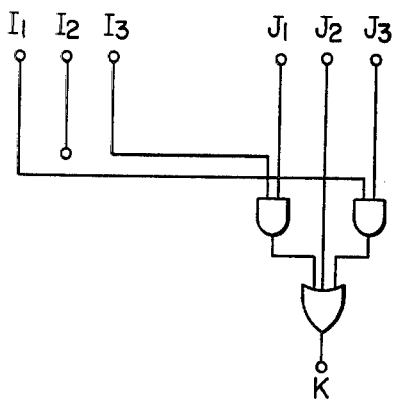

An exemplary circuit for implementing the above conditions is illustrated in FIG. 4B. Under these conditions, the bright spot control logic circuit will produce the video signal output 501n, provided that (d) the quantity to be displayed at the instant time point coincides with the instant scan line number (i.e. when the input signal "1" is present at the terminal $J_2$), (e) the instant scan line number is smaller than the quantity to be displayed at the instant time point and greater than the display quantity at the immediately following time point (i.e. when the input signal "1" is present at both the terminals $I_1$ and $J_3$), or (f) the scan line number is greater than the quantity to be displayed at the instant time point and smaller than the immediately following display quantity (i.e. the input signal "1" is present at both the terminals $I_3$ and $J_1$).

Figure 6C:
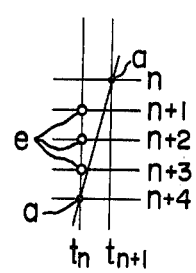
Figure 6D:
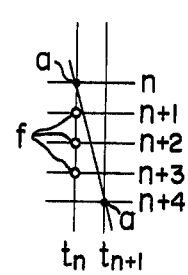

Consequently, assuming by way of example that the quantity to be displayed at the instant time point $t_n$ is equal to n+4, while the quantity to be displayed at the immediately following time point $t_{n+1}$ is equal to n, then the bright spot will be generated at the end point a where the instant display quantity coincides with the instant scan line number, points e where the associated scan line numbers are smaller than the instant display quantity and greater than the immediately following display quantity, and points f where the associated scan line numbers are greater than the instant display quantity and smaller than the one to be displayed at the immediately following time point, as shown in FIGS. 6C and 6D.

Figure 5:
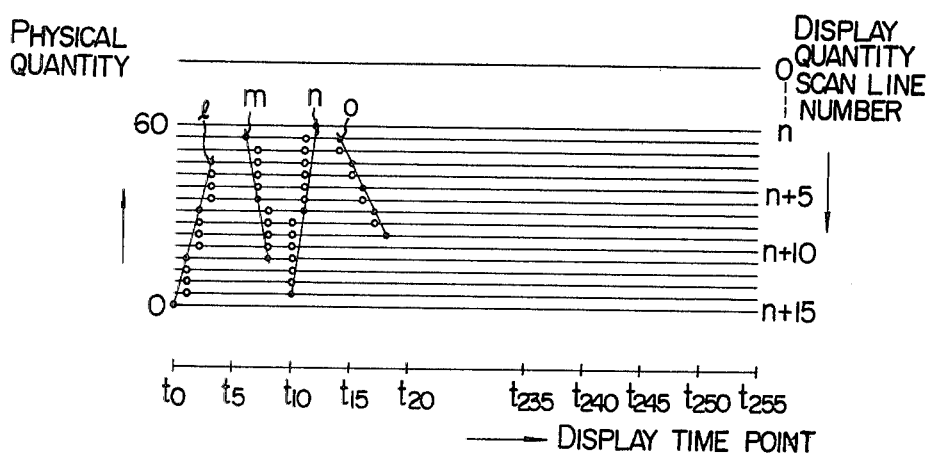
FIG. 5 illustrates an example of trend graph presentation which can be produced by the trend graph adapter according to the invention.

In this manner, clear display of the trend graph can be accomplished through the interpolation of the bright spots, even if the trend data undergoes rapid variation, as is shown by the trend lines n and o in FIG. 5.

Figure 7:
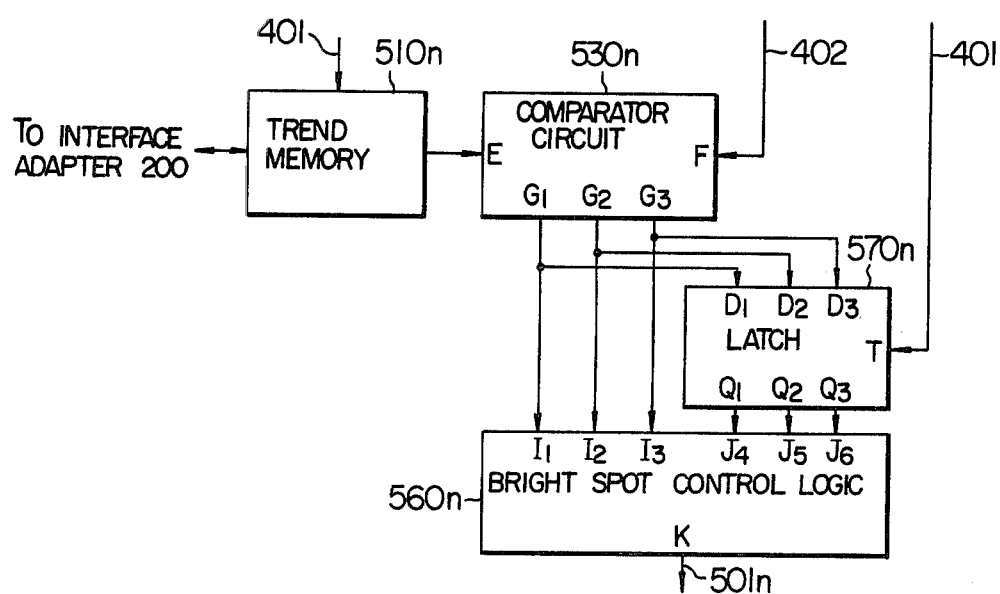
FIG. 7 is a block diagram showing another exemplary embodiment of the trend graph adapter according to the invention.

FIG. 7 shows another embodiment of the invention which differs from the one shown in FIG. 3 in that a latch circuit 570n for fetching therein the result of comparison from the first comparator circuit 530n is provided in place of the second comparator circuit 540n and the data latch circuit 550n. The comparison latch circuit 570n has input terminals $D_1$, $D_2$ and $D_3$ connected to the output terminals $G_1$, $G_2$ and $G_3$ of the first comparator circuit 530n and a trigger terminal T adapted to be applied with the dot timing pulse 401 for every display time point. Accordingly, in a case of reading out the display quantity corresponding to the instant time point from the data memory 510n, there is produced at the output terminals $Q_1$, $Q_2$ and $Q_3$ the output signals representing the results of comparison between the trend quantity to be displayed at the time point immediately preceding the instant time point and the instant scan line number. These outputs $Q_1$ to $Q_3$ are thus absolutely identical with the output signals $H_1$ to $H_3$ from the second comparison circuit 540n shown in FIG. 3 and applied to the bright spot control logic circuit 560 to produce the video signal 501n.

In this embodiment, it is also possible as in the case of the embodiment of FIG. 3 to arrange the circuits so as to read out the display quantity corresponding to the immediately following time point from the data memory. The circuit configuration shown in FIG. 7 allows the amount of hardware to be reduced as compared with the circuit shown in FIG. 3. Particularly, IC can be reduced for every trend graph adapter, reducing the total number of IC's used when a plurality of the trend graph adapters are employed for producing a corresponding number of trend curves on a single screen.

It will be now appreciated that the invention has provided a trend graph display system which is capable of producing a clear image of trend graphs independently from rapid variations in the trend data with a simplified circuit arrangement.

We claim:

1. A trend graph display system including a cathode ray tube having a viewing screen on which time points represented by a plurality of points serially related in time spaced from one another with a predetermined time interval are displayed in the raster direction, while display quantities of trend graphs are displayed as functions of said time points in the direction perpendicular to said raster direction by respective pluralities of point s spaced from one another with a predetermined interval, each point of said respective plurality located in a different raster scan from the remaining points of said respective plurality, said cathode ray tube being so adapted that a raster scanning is effected by sweeping said viewing screen with a scanning point whereby the scanning lines thus produced are correlated to said spaced points representing said display quantities, further including;

memory means for storing said display quantities of said trend graph corresponding to said serially related time points;

reading means for sequentially reading out said display quantities from said memory means in the order of said serially related time points; and comparison means for comparing the display quantity read out from said memory means with a display quantity represented by an instant scan line, said comparison means comparing the display quantity read out from said memory means corresponding to an instant time point corresponding to an instant position of the scanning spot of said instant scan line on said viewing screen with a display quantity represented by an instant scan line, thereby to supply a video signal to said cathode ray tube upon coincidence being found in said comparison, said comparison means further including means for supplying said video signal to said cathode ray tube when said instant display quantity represented by said instant scan line lies in a range delimited by the display quantity at said instant time point and the display quantity at the selected one time point of the time points immediately preceding and following said instant time point.

2. A trend graph display system according to claim 1, wherein said reading means is adapted to output read-out signals for sequentially reading out said display quantities from said memory means and a scan line signal representing the display quantity to be displayed by the instant scan line, while said memory means is adapted to output said display quantities sequentially in the order of said display time points in response to said read-out signals, and wherein said comparison means includes a latch circuit for producing said display quantity read out from said memory means with a delay equal to the duration of said predetermined time interval, a first comparator circuit for comparing the display quantity read out from said memory means and said scan line signal, a second comparator circuit for comparing said delayed display quantity output from said latch circuit with said scan line signal, and a video signal generating circuit for producing said video signal in dependence on the results of comparisons at said first and second comparator circuits.

3. A trend graph display system according to claim 1, wherein said reading means is adapted to output read-out signals for sequentially reading out said display quantities from said memory means and a scan line signal representing the display quantity to be displayed by the instant scan line, while said memory means is adapted to output said display quantities sequentially in the order of said display time points in response to said read-out signal, wherein said comparison means includes a comparator circuit for comparing said display quantity read out from said memory means with said scan line signal, a latch circuit for producing the result of comparison at said comparator circuit with a delay corresponding to the duration of said predetermined time interval, and a video signal generator circuit for producing said video signal in dependence on said result of comparison and the output state of said latch circuit.

4. A trend graph display system according to claim 2, wherein said memory means is adapted to output sequentially said display quantities each corresponding to said instant time point corresponding to the instant position of said scan spot on said viewing screen in response to said read-out signal.

5. A trend graph display system according to claim 2, wherein said memory means is adapted to output sequentially said display quantities each corresponding to a time point following immediately the instant time point corresponding to the instant position of said scan spot on said viewing screen in response to said read-out signal.

6. A trend graph display system according to claim 3, wherein said memory means is adapted to output sequentially said display quantities each corresponding to said instant time point corresponding to the instant position of said scan spot on said viewing screen in response to said read-out signal.

7. A trend graph display system according to claim 3, wherein said memory means is adapted to output sequentially said display quantities each corresponding to a time point following immediately the instant time point corresponding to the instant position of said scan spot on said viewing screen in response to said read-out signal.

8. A trend graph display system according to claim 4, wherein said first comparator circuit is adapted to produce a first, a second and a third signal, respectively, in response to magnitudes of said scan line signal greater than, equal to and smaller than said display quantity at said instant time point, while said second comparator circuit is adapted to produce a fourth, a fifth and a sixth signal, respectively, in response to magnitudes of said scan line signal greater than, equal to and smaller than said display quantity at a time point immediately preceding said instant time point, and wherein said video signal generator circuit is adapted to output the video signal when said second signal is present, when both of said first and sixth signal are present or when both of said third and fourth signals are present.

9. A trend graph display system according to claim 5, wherein said first comparator circuit is adapted to produce a first, a second and a third signal, respectively, in response to magnitudes of said scan line signal greater than, equal to and smaller than said display quantity at a time point immediately following said instant time point, while said second comparator circuit is adapted to produce a fourth, a fifth and a sixth signal, respectively, in response to magnitudes of said scan line signal greater than, equal to and smaller than said display quantity at said instant time point, and wherein said video signal generator circuit is adapted to output the video signal when said fifth signal is present, when both of said first and sixth signal are present or when both of said third and fourth signals are present.

10. A trend graph display system according to claim 8, wherein said video signal generator circuit is adapted to further output the video signal when said fifth signal is present.

11. A trend graph display system according to claim 9, wherein said video signal generator circuit is adapted to further output the video signal when said second signal is present.

12. A trend graph display system according to claim 6, wherein said comparator circuit is adapted to produce a first, a second and a third signal, respectively, in response to magnitudes of said scan line signal greater than, equal to and smaller than said display quantity at said instant time point, while said latch circuit is adapted to delay said first, second and third signals by a time corresponding to the duration of said predetermined time interval thereby outputting them as a fourth, a fifth and a sixth signal respectively, and wherein said video signal generator circuit is adapted to output the video signal when said second signal is present, when both of said first and sixth signals are present, or when both of said third and fourth signals are present.

13. A trend graph display system according to claim 7, wherein said comparator circuit is adapted to produce a first, a second and a third signal, respectively, in response to magnitudes of said scan line signal greater than, equal to and smaller than said display quantity at a time point immediately following said instant time point, while said latch circuit is adapted to delay said first, second and third signals by a time corresponding to the duration of said predetermined time interval thereby outputting them as a fourth, a fifth and a sixth signal respectively, and wherein said video signal generator circuit is adapted to output the video signal when said fifth signal is present, when both of said first and sixth signals are present, or when both of said third and fourth signals are present.

14. A trend graph display system according to claim 12, wherein said video signal generator circuit is adapted to further output the video signal when said fifth signal is present.

15. A trend graph display system according to claim 13, wherein said video signal generator circuit is adapted to further output the video signal when said second signal is present.

* * * * *